(12) United States Patent
Tang

(10) Patent No.: US 11,088,158 B2
(45) Date of Patent: Aug. 10, 2021

(54) SONOS MEMORY AND METHOD FOR MANUFACTURING THE SAME

(71) Applicant: Shanghai Huali Integrated Circuit Corporation, Shanghai (CN)

(72) Inventor: Xiaoliang Tang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 12 days.

(21) Appl. No.: 16/721,476

(22) Filed: Dec. 19, 2019

(65) Prior Publication Data

US 2020/0365610 A1    Nov. 19, 2020

(30) Foreign Application Priority Data

May 15, 2019   (CN) .......................... 201910400757.2

(51) Int. Cl.
| | |
|---|---|
| *H01L 29/40* | (2006.01) |
| *H01L 27/11568* | (2017.01) |
| *H01L 21/28* | (2006.01) |
| *H01L 21/3213* | (2006.01) |
| *H01L 29/423* | (2006.01) |
| *H01L 29/49* | (2006.01) |
| *H01L 29/51* | (2006.01) |
| *H01L 29/66* | (2006.01) |
| *H01L 29/792* | (2006.01) |

(52) U.S. Cl.
CPC .. *H01L 27/11568* (2013.01); *H01L 21/32133* (2013.01); *H01L 29/40117* (2019.08); *H01L 29/42344* (2013.01); *H01L 29/4916* (2013.01); *H01L 29/513* (2013.01); *H01L 29/518* (2013.01); *H01L 29/66833* (2013.01); *H01L 29/792* (2013.01)

(58) Field of Classification Search
None
See application file for complete search history.

(56) References Cited

U.S. PATENT DOCUMENTS

2003/0198086 A1* 10/2003 Shukuri ............ H01L 27/11521
                                                 365/185.18
2007/0040197 A1*  2/2007 Yang ................. G11C 16/0458
                                                 257/296

(Continued)

FOREIGN PATENT DOCUMENTS

CN      101393918 A    3/2009
CN      101442076 A    5/2009

(Continued)

OTHER PUBLICATIONS

Feb. 2, 2021—(CN) CNIPA First Search Report Appn 201910400757.2.

*Primary Examiner* — Moin M Rahman
(74) *Attorney, Agent, or Firm* — Banner & Witcoff, Ltd.

(57) ABSTRACT

The present invention discloses a SONOS memory in which two storage gates in a storage unit are self-aligned on the side of a selection gate, states of information stored in two storage gates in the same storage unit being opposite, the storage information of the storage unit being judged by comparing the magnitude of reading currents corresponding to two storage gates. The present invention further discloses a method for manufacturing a SONOS memory. The present invention can improve the reliability of the product and reduce the area of the device at the same time.

12 Claims, 12 Drawing Sheets

(56) References Cited

U.S. PATENT DOCUMENTS

| | | |
|---|---|---|
| 2007/0161195 A1 | 7/2007 | Lee et al. |
| 2008/0081414 A1* | 4/2008 | Lee ................... H01L 27/11531 |
| | | 438/257 |
| 2010/0163966 A1* | 7/2010 | Kwon ............... H01L 27/11568 |
| | | 257/324 |
| 2012/0087190 A1* | 4/2012 | Lee ........................ G11C 16/14 |
| | | 365/185.17 |
| 2014/0183618 A1 | 7/2014 | Hee |
| 2014/0198583 A1* | 7/2014 | Kern ...................... G11C 16/26 |
| | | 365/185.33 |

FOREIGN PATENT DOCUMENTS

| | | |
|---|---|---|
| CN | 101872647 A | 10/2010 |
| CN | 107836042 A | 3/2018 |

\* cited by examiner

US 11,088,158 B2

SONOS MEMORY AND METHOD FOR MANUFACTURING THE SAME

CROSS REFERENCE TO RELATED APPLICATIONS

The present application claims priority to and the benefit of Chinese Patent Application No. 201910400757.2 filed on May 15, 2019, the disclosure of which is incorporated herein by reference in its entirety as part of the present application.

FIELD OF THE INVENTION

The present invention relates to the field of semiconductor integrated circuit manufacturing, in particular to a SONOS memory. The present invention also relates to a method for manufacturing a SONOS memory.

BACKGROUND

As illustrated in FIG. 1, which illustrates a structural view of a storage unit of the existing SONOS memory, the storage unit of the existing SONOS memory comprises two independent transistor structures, namely a selection transistor 101 and a storage transistor 102. The SONOS memory is formed on a semiconductor substrate such as a silicon substrate. The storage unit of the SONOS memory is formed in the storage region. Outside the storage region, there is usually also a logic device region. The illustrated logic device region is used for forming a logic device. In the storage region, a deep N-well (DNW) 103 is formed on the semiconductor substrate, and a P-well 104 and a storage well 105 are respectively formed in the deep N-well 103. The P-well 104 is formed in the formation area of the selection transistor 101, and the storage well 105 is formed in the formation area of the storage transistor 102. Usually, the channel conduction type of the storage transistor 102 is N-type, so the storage well 105 is also P-type doped.

The gate structure of the selection transistor 101 comprises a gate dielectric layer such as a gate oxide layer 106 and a polycrystalline silicon gate 108 which are sequentially superimposed. The gate structure of the storage transistor 102 comprises an ONO layer 107 and a polycrystalline silicon gate 108 which are sequentially superimposed. Although the ONO layer 107 in FIG. 1 is represented by adopting an integral layered structure, in fact the ONO layer 107 is formed by a first oxide layer, a second nitride layer and a third oxide layer through superposition.

A sidewall 109 is formed on the side surface of the polycrystalline silicon gate 108. Usually the material of the sidewall 109 comprises an oxide layer or a nitride layer. In FIG. 1, the sidewall 109 is formed by an oxide layer 109a, a nitride layer 109b, an oxide layer 109c and a nitride layer 109d through superposition, in which the oxide layer 109a is usually formed by directly oxidizing the silicon of the polycrystalline silicon gate 108.

The storage unit further comprises three source-drain regions, i.e., respectively source-drain regions 110a, 110b and 110c, wherein the source-drain region 110b is shared by the selection transistor 101 and the storage transistor 102.

In use, the storage transistor 102 is used for storing data information and the selection transistor 101 is used for selecting the storage transistor 102. When the corresponding storage transistor 102 needs to be selected, the polycrystalline silicon gate 108 of the selection transistor 101 needs to be applied with a voltage higher than a threshold voltage (Vt), such that a channel for conducting the source-drain regions 110a and 110b is formed on the surface of the P-well 104 covered by the gate structure of the selection transistor 101. So the selection transistor 101 is mainly used for conduction and turn-off of the storage transistor 102 to reduce leakage, while the storage transistor 102 is mainly used for storing charges. A tunneling injection region 111 is further formed in the surface area of the storage well 105 of the storage transistor 102. The first oxide layer in the ONO layer 107 is a tunneling oxide layer, the second nitride layer serves as an information storage layer, and the third oxide layer serves as a control oxide layer. In the programming process, storage electrons penetrate through the first oxide layer 111 and are injected into the second nitride layer from the tunneling injection region.

As illustrated in FIG. 2A to FIG. 2G, which illustrate structural views of a storage unit in each step of a method for manufacturing the existing SONOS memory, the method comprises the following steps:

As illustrated in FIG. 2A, a semiconductor substrate such as a silicon substrate is provided, a storage unit of a SONOS memory is formed in a storage region, the outside of the storage region usually further comprises a logic device region, and the logic device region is used for forming a logic device. In the storage region, a deep N-well 103 is formed on the semiconductor substrate, and a P-well 104 and a storage well 105 are formed in the deep N-well 103. The P-well 104 is formed in the formation area of the selection transistor 101, and the storage well 105 is formed in the formation area of the storage transistor 102. Usually, the channel conduction type of the storage transistor 102 is N-type, so the storage well 105 is also P-type doped.

A gate dielectric layer, such as a gate oxide layer 106, is formed on the surface of the semiconductor substrate.

As illustrated in FIG. 2B, the top of the storage well 105 is opened by adopting a tunneling injection mask 201, and then tunneling injection 202 is performed to the tunneling injection region 111; and then the gate dielectric layer 106 in the opened area is removed.

As illustrated in FIG. 2C, an ONO layer 107 is formed, and the ONO layer 107 is formed by a first oxide layer, a second nitride layer and a third oxide layer through superposition.

As illustrated in FIG. 2D, the area of the storage well 105 is covered by an ONO layer mask 203, and the ONO layer 107 outside the area covered by the ONO layer mask 203 is removed by adopting an etching process marked as 204. As illustrated in FIG. 2E, it illustrates a structural view after the ONO layer 107 outside the area covered by the ONO layer mask 203 is removed.

As illustrated in FIG. 2F, a polycrystalline silicon gate 108 is deposited, the polycrystalline silicon gate 108 is etched by adopting a lithography definition and an etching process, and simultaneously the gate structures of the selection transistor 101 and the storage transistor 102 are formed. The gate structure of the selection transistor 101 comprises a gate dielectric layer such as a gate oxide layer 106 and a polycrystalline silicon gate 108 which are sequentially superposed. The gate structure of the storage transistor 102 comprises an ONO layer 107 and a polycrystalline silicon gate 108 which are sequentially superposed.

As illustrated in FIG. 2G, the etching process marked as 205 is performed to remove the gate dielectric layer 106 and the ONO layer 107 outside the area covered by the polycrystalline silicon gate 108.

Usually, before forming the sidewall 109, the method further comprises performing Lightly Doped Drain (LDD) injection to form a lightly doped drain region.

Then, as illustrated in FIG. 1, the sidewall 109 is formed, and source-drain injection is performed to form source-drain regions 110a, 110b and 110c.

Usually, the SONOS memory realizes data storage through different Vt states of the storage transistor 102 in the storage unit. Usually, after electrons are injected into the ONO layer 107 of the gate structure of the storage transistor 102, Vt will increase, and at this moment, the stored data is "1", as illustrated in FIG. 3B, which is a schematic view when the data stored in the storage unit of the existing SONOS memory illustrated in FIG. 1 is "1". When the electrons in the ONO layer 107 of the gate structure of the storage transistor 102 are erased, Vt will decrease, and at this moment, the stored data is "0", as illustrated in FIG. 3A, which is a schematic view when the data stored in the storage unit of the existing SONOS memory illustrated in FIG. 1 is "0".

When reading the storage unit, the reading current is usually compared with the reference current. When the reading current is greater than the reference current, the stored data is "0"; and when the reading current is smaller than the reference current, the stored data is "1".

In order to achieve higher requirements on reliability, mainly to improve data retention, the existing technology adopts the "differential method" for design, i.e., two storage units illustrated in FIG. 1 are used as one storage unit, "0" and "1" are distinguished no longer by comparing the reading current of one storage unit with the reference current, but by comparing the reading currents of the two storage units. As illustrated in FIG. 4A, it is a schematic view of first-type data of a data storage unit consisting of two storage units of the existing SONOS memory illustrated in FIG. 1. It can be seen that a storage unit 301 actually storing data comprises two storage units illustrated in FIG. 1, the storage unit illustrated in FIG. 1 is a physical storage unit, and two physical storage units are combined to form one storage unit 310 for storing data. In FIG. 4A, the storage transistor 102 of the first physical storage unit stores data "0" and the storage transistor 102 of the second physical storage unit stores data "1", thus the reading current of the storage transistor 102 of the first physical storage unit is greater than that of the storage transistor 102 of the second physical storage unit, and at this moment the stored data corresponding to the storage unit 301 is "0".

As illustrated in FIG. 4B, it is a schematic view of second-type data of a data storage unit consisting of two storage units of the existing SONOS memory illustrated in FIG. 1. In FIG. 4B, the storage transistor 102 of the first physical storage unit stores data "1" and the storage transistor 102 of the second physical storage unit stores data "0", thus the reading current of the storage transistor 102 of the first physical storage unit is smaller than that of the storage transistor 102 of the second physical storage unit, and at this moment the stored data corresponding to the storage unit 301 is "1".

When the storage units illustrated in FIG. 4A and FIG. 4B for storing data are adopted, each of which consists of two storage units illustrated in FIG. 1A, since the reading currents of the two physical storage units are directly compared when reading, the data retention of the memory can be greatly increased, and thus it can be applied to products requiring higher reliability, such as automotive electronics. However, the problems are that it will greatly increase the area of the storage unit and two physical storage units need to be used for storing a piece of data.

SUMMARY OF THE INVENTION

The technical problem to be solved by the present invention is to provide a SONOS memory, which can improve product reliability and reduce device area. For this purpose, the present invention further provides a method for manufacturing a SONOS memory.

In order to solve the above technical problem, a storage unit of the SONOS memory provided by the present invention comprises:

a first gate structure formed by a gate dielectric layer formed on the surface of a semiconductor substrate and a first polycrystalline silicon gate through superposition;

first sidewalls formed on two side surfaces of the first gate structure through self-alignment; and a second gate structure formed on the side surface of the first sidewall on the first side surface of the first gate structure through self-alignment, and a third gate structure formed on the side surface of the first sidewall on the second side surface of the first gate structure through self-alignment.

The second gate structure and the third gate structure are respectively formed by an ONO layer and a second polycrystalline silicon gate through superposition, the second polycrystalline silicon gate is in a sidewall structure, and the first sidewall realizes the isolation between the first polycrystalline silicon gate and the corresponding second polycrystalline silicon gate.

The ONO layer is formed by a first oxide layer, a second nitride layer and a third oxide layer through superposition, and the second nitride layer is used for storing information.

The first gate structure forms a selection gate, and the second gate structure and the third gate structure form two storage gates; states of information stored in the second gate structure and the third gate structure in the same storage unit are opposite, and the storage information of the storage unit is judged by comparing the magnitude of the reading currents corresponding to the second gate structure and the third gate structure.

As a further improvement, the semiconductor substrate is a silicon substrate.

As a further improvement, the gate dielectric layer is a gate oxide layer.

As a further improvement, a P-well is formed in the semiconductor substrate in the formation area of the storage unit.

As a further improvement, a tunneling injection region is formed in the surface area of the P-well covered by the second gate structure and the third gate structure.

As a further improvement, the P-well is formed in a deep N-well and the deep N-well is formed in the semiconductor substrate.

As a further improvement, a first source-drain region consisting of N+ regions is formed in the P-well outside the side surface of the second gate structure through self-alignment; and a second source-drain region consisting of N+ regions is formed in the P-well outside the side surface of the third gate structure through self-alignment.

As a further improvement, the SONOS memory is a device applied to automotive electronic products.

In order to solve the above technical problem, steps of manufacturing a storage unit of the SONOS memory in the method for manufacturing the SONOS memory provided by the present invention comprise:

step 1: sequentially growing a gate dielectric layer and depositing a first polycrystalline silicon gate on the surface of a semiconductor substrate, and forming a first gate structure formed by the gate dielectric layer and the first polycrystalline silicon gate through superposition in a selected area by adopting a lithography definition and polycrystalline silicon etching process;

step 2: forming first sidewalls on two side surfaces of the first gate structure through self-alignment;

step 3: removing the gate dielectric layer outside the first gate structure, and then depositing an ONO layer, the ONO layer covering the side surfaces of the first sidewalls, the top surface of the first polycrystalline silicon gate and the surface of the semiconductor substrate outside the first gate structure;

the ONO layer being formed by a first oxide layer, a second nitride layer and a third oxide layer through superposition, and the second nitride layer being used for storing information;

step 4: depositing a second polycrystalline silicon gate, the second polycrystalline silicon gate covering the surface of the ONO layer; and step 5: performing comprehensive polycrystalline silicon etching to form the second polycrystalline silicon gate which is in a sidewall structure on the side surface of the corresponding first sidewall through self-alignment.

The second gate structure and the third gate structure are respectively formed by the ONO layer and the second polycrystalline silicon gate through superposition, the second gate structure is formed on the side surface of the first sidewall on the first side surface of the first gate structure through self-alignment, and the third gate structure is formed on the side surface of the first sidewall on the second side surface of the first gate structure through self-alignment.

The first sidewall realizes the isolation between the first polycrystalline silicon gate and the corresponding second polycrystalline silicon gate.

The first gate structure forms a selection gate, and the second gate structure and the third gate structure form two storage gates; states of information stored in the second gate structure and the third gate structure in the same storage unit are opposite, and the storage information of the storage unit is judged by comparing the magnitude of the reading currents corresponding to the second gate structure and the third gate structure.

As a further improvement, the semiconductor substrate is a silicon substrate.

As a further improvement, the gate dielectric layer is a gate oxide layer.

As a further improvement, a P-well is formed in the semiconductor substrate in the formation area of the storage unit.

As a further improvement, before forming the ONO layer in step 3, the method further comprises a step of forming a tunneling injection region in the surface area of the P-well covered by the second gate structure and the third gate structure, the tunneling injection region is defined by a tunneling injection mask, and after opening the tunneling injection region by using the tunneling injection mask, the method comprises a step of removing the gate dielectric layer in the opened area and a step of performing ion injection to form the tunneling injection region.

After depositing the ONO layer in step 3, the method further comprises a step of performing definition by using an ONO layer mask and etching the ONO layer for removing the ONO layer outside the formation area of each storage unit of the SONOS memory.

As a further improvement, the P-well is formed in a deep N-well and the deep N-well is formed in the semiconductor substrate.

As a further improvement, after forming the second polycrystalline silicon gate in the sidewall structure in step 5, the method further comprises a step of performing self-aligned N+ injection to form a first source-drain region and a second source-drain region, the first source-drain region is formed in the P-well outside the side surface of the second gate structure through self-alignment, and the second source-drain region is formed in the P-well outside the side surface of the third gate structure through self-alignment.

The storage unit of the SONOS memory provided by the present invention adopts three gate structures, the first gate structure is formed by the gate dielectric layer and the first polycrystalline silicon gate through superposition and serves as the selection gate, the second gate structure and the third gate structure are respectively formed by the ONO layer and the second polycrystalline silicon gate through superposition, and the second polycrystalline silicon gate is in a sidewall structure and is formed on two sides of the first gate structure through self-alignment, such that the second gate structure and the third gate structure are formed on the two sides of the first gate structure through self-alignment. Since the self-aligned structure can minimize the size of the device, the area of the device can be greatly reduced in the present invention.

In addition, since the second gate structure and the third gate structure of the storage unit of the present invention are both used as storage gates, two bits of information can be stored in one storage unit. Since in the present invention the two storage states, i.e., the two opposite states of information stored in the second gate structure and the third gate structure of the same storage unit are used as storage information of the entire storage unit, and the storage information of the storage unit is judged by comparing the magnitude of the reading currents corresponding to the second gate structure and the third gate structure, i.e., a differential technology is adopted, the present invention can greatly improve the reliability of the product and can be applied to products requiring higher reliability, such as automotive electronics.

Moreover, the second gate structure and the third gate structure of the present invention are defined on the two sides of the first gate structure through self-alignment, no additional lithography process is required and thus the process cost of the present invention is low.

DESCRIPTION OF THE DRAWINGS

The present invention will be further described below in detail in combination with the specific embodiments with reference to the drawings.

DETAILED DESCRIPTION

Figure 1:
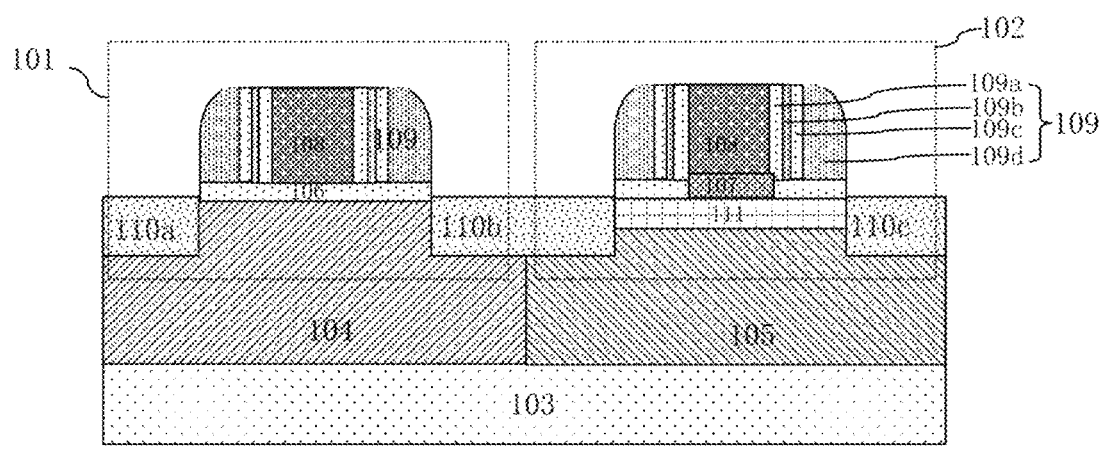
FIG. 1 illustrates a structural view of a storage unit of the existing SONOS memory.
Figure 2A:
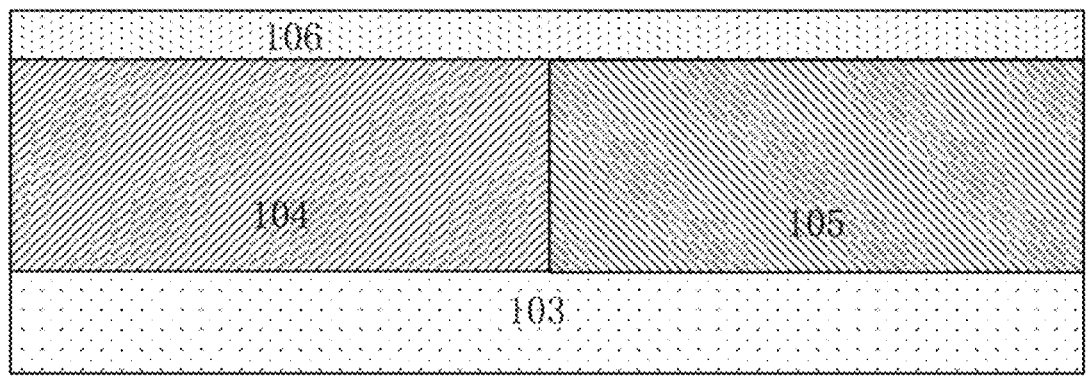
FIG. 2A to FIG. 2G illustrate structural views of a storage unit in each step of a method for manufacturing the existing SONOS memory.
Figure 2B:
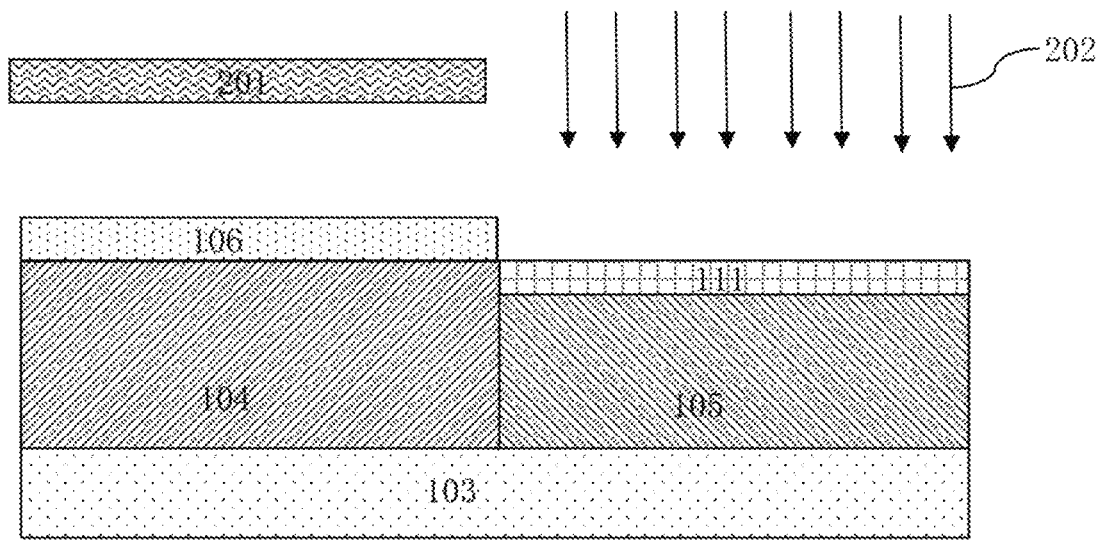
Figure 2C:
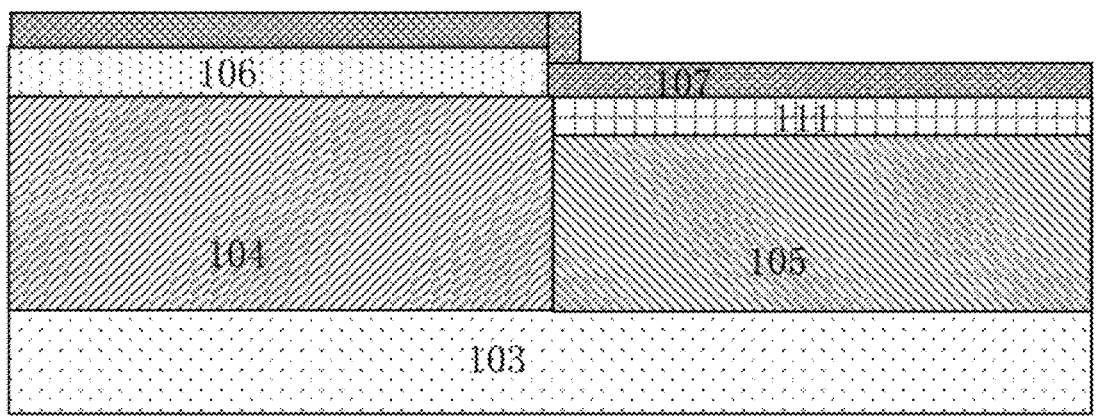
Figure 2D:
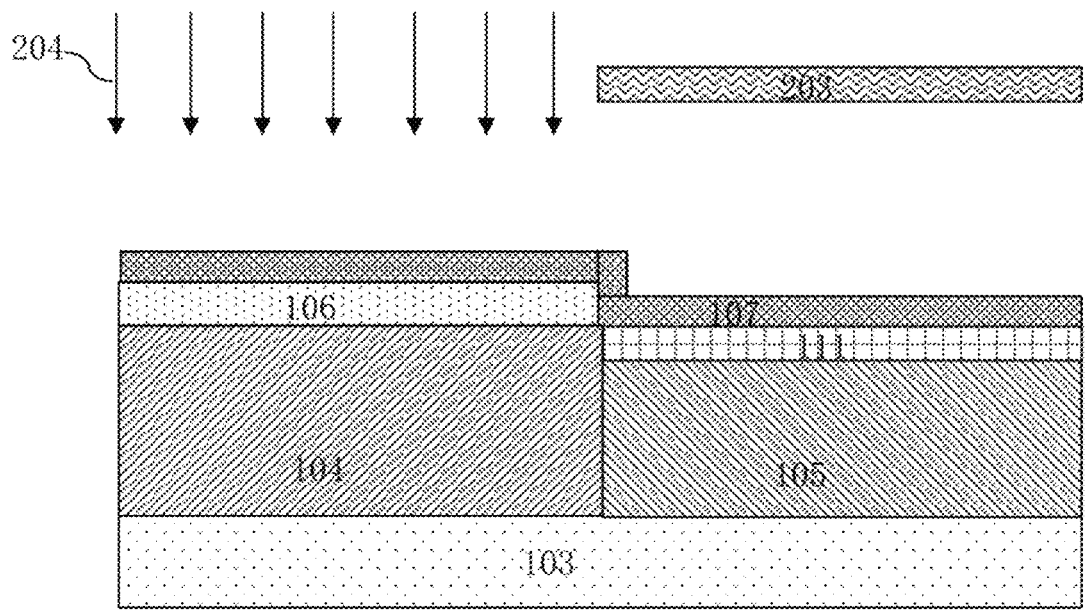
Figure 2E:
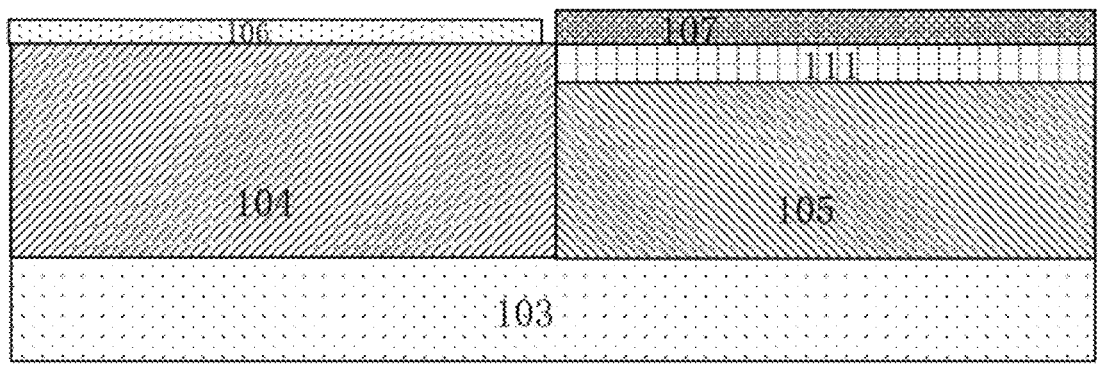
Figure 2F:
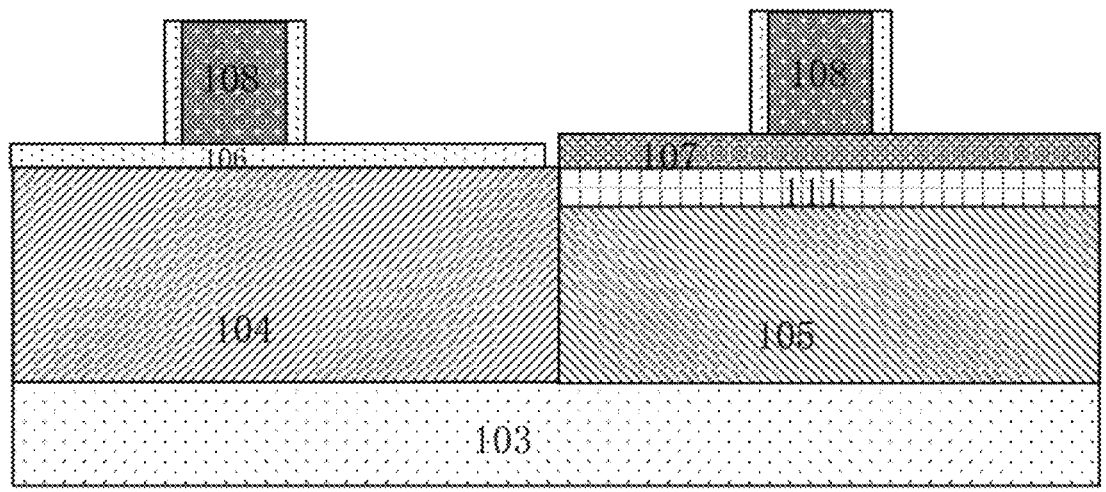
Figure 2G:
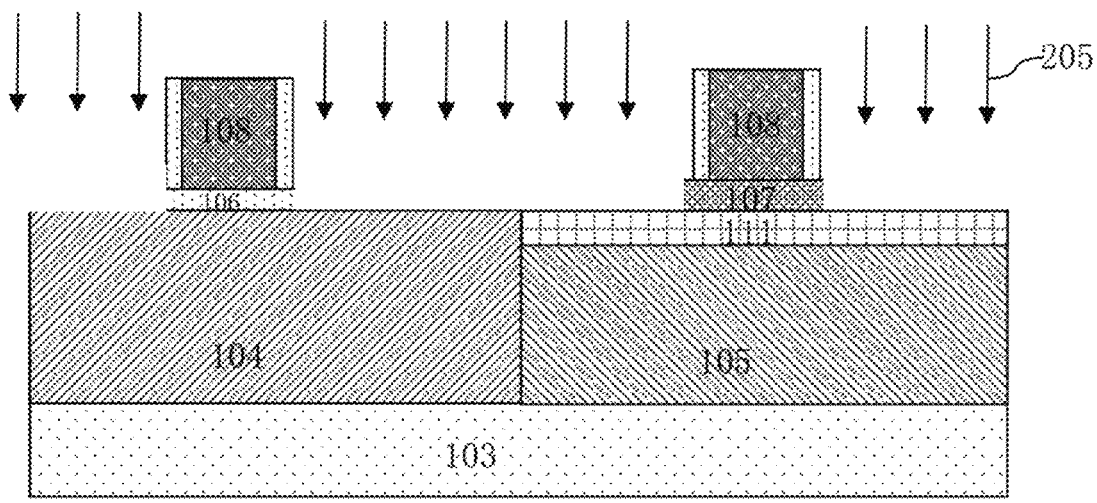
Figure 3A:
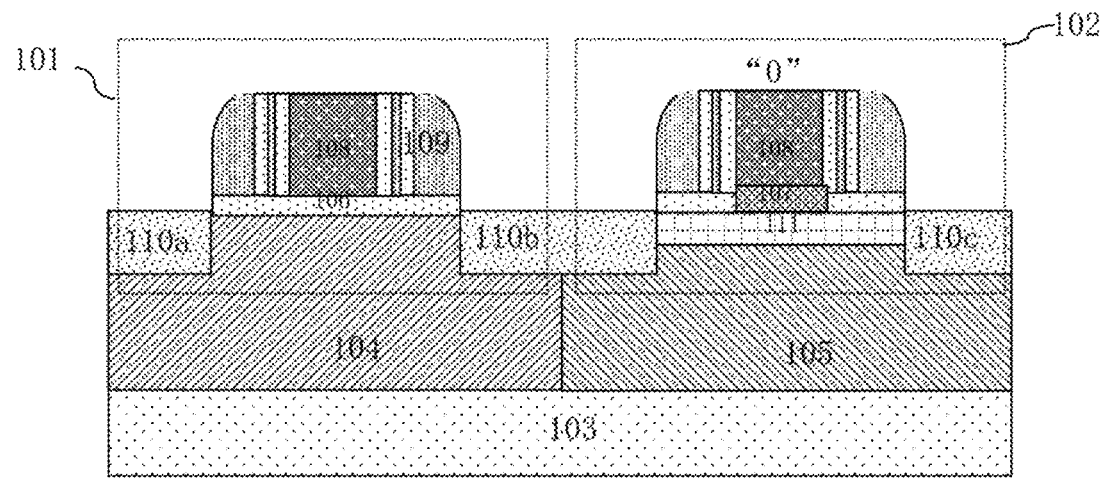
FIG. 3A illustrates a schematic view when the data stored in the storage unit of the existing SONOS memory illustrated in FIG. 1 is "0".
Figure 3B:
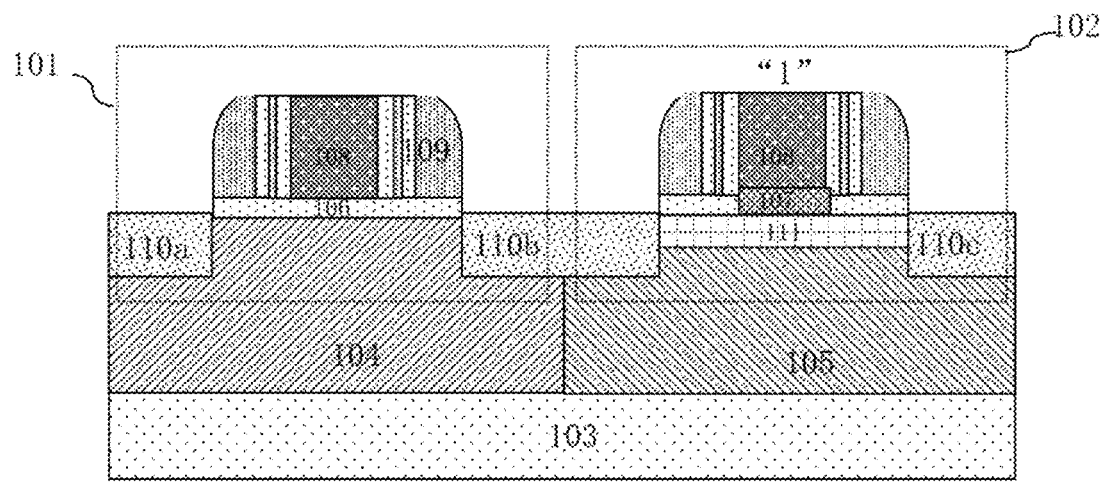
FIG. 3B illustrates a schematic view when the data stored in the storage unit of the existing SONOS memory illustrated in FIG. 1 is "1".
Figure 4A:
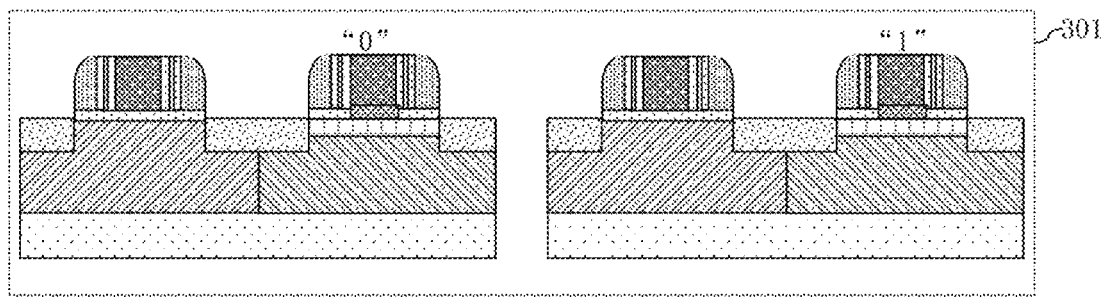
FIG. 4A illustrates a schematic view of first-type data of a data storage unit consisting of two storage units of the existing SONOS memory illustrated in FIG. 1.
Figure 4B:
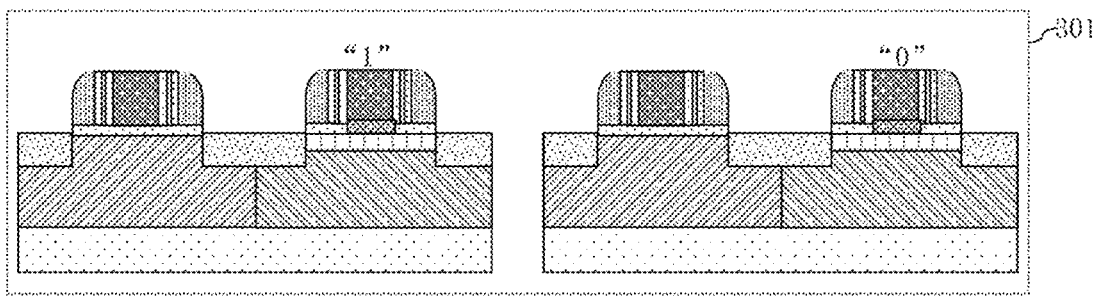
FIG. 4B illustrates a schematic view of second-type data of a data storage unit consisting of two storage units of the existing SONOS memory illustrated in FIG. 1.
Figure 5:
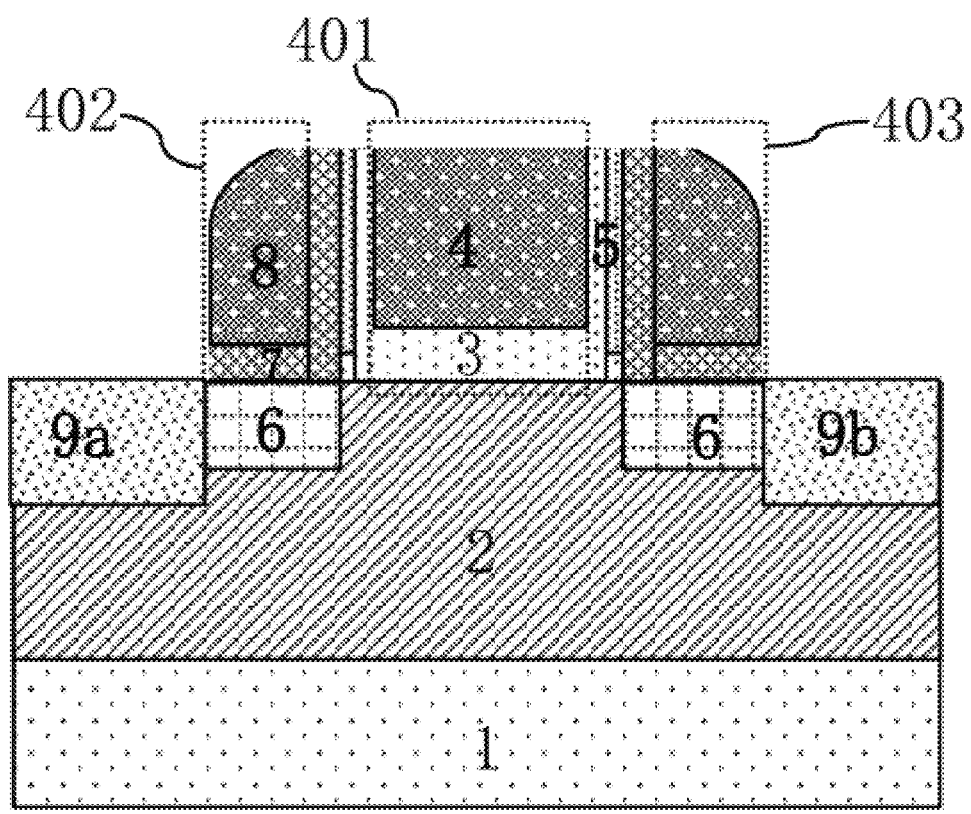
FIG. 5 illustrates a structural view of a storage unit of a SONOS memory according to one embodiment of the present invention.

As illustrated in FIG. 5, which illustrates a structural view of a storage unit of a SONOS memory according to one embodiment of the present invention, a storage unit of the SONOS memory according to one embodiment of the present invention comprises:

a first gate structure 401 formed by a gate dielectric layer 3 formed on the surface of a semiconductor substrate and a first polycrystalline silicon gate 4 through superposition.

In the embodiment of the present invention, the semiconductor substrate is a silicon substrate.

The gate dielectric layer 3 is a gate oxide layer.

A P-well 2 is formed in the semiconductor substrate in the formation area of the storage unit. The P-well 2 is formed in a deep N-well 1 and the deep N-well 1 is formed in the semiconductor substrate.

First sidewalls 5 are formed on two side surfaces of the first gate structure 401 through self-alignment.

A second gate structure 402 is formed on the side surface of the first sidewall 5 on the first side surface of the first gate structure 401 through self-alignment, and a third gate structure 403 is formed on the side surface of the first sidewall 5 on the second side surface of the first gate structure 401 through self-alignment.

The second gate structure 402 and the third gate structure 403 are respectively formed by an ONO layer 7 and a second polycrystalline silicon gate 8 through superposition, the second polycrystalline silicon gate 8 is in a sidewall structure, and the first sidewall 5 realizes the isolation between the first polycrystalline silicon gate 4 and the corresponding second polycrystalline silicon gate 8. In the embodiment of the present invention, the first polycrystalline silicon gate 4 and the corresponding second polycrystalline silicon gate 8 are further isolated by the ONO layer 7.

A tunneling injection region 6 is formed in the surface area of the P-well 2 covered by the second gate structure 402 and the third gate structure 403.

A first source-drain region 9a consisting of N+ regions is formed in the P-well 2 outside the side surface of the second gate structure 402 through self-alignment; and a second source-drain region 9b consisting of N+ regions is formed in the P-well 2 outside the side surface of the third gate structure 403 through self-alignment.

The ONO layer 7 is formed by a first oxide layer, a second nitride layer and a third oxide layer through superposition, wherein the first oxide layer is a tunneling oxide layer; the second nitride layer is used as an information storage layer and is used for storing information; and the third oxide layer is used as a control oxide layer.

The first gate structure 401 forms a selection gate, and the second gate structure 402 and the third gate structure 403 form two storage gates; states of information stored in the second gate structure 402 and the third gate structure 403 in the same storage unit are opposite, and the storage information of the storage unit is judged by comparing the magnitude of the reading currents corresponding to the second gate structure 402 and the third gate structure 403. Thus, the reliability of the SONOS memory can be improved, such that the SONOS memory according to the embodiment of the present invention can be used as a memory for automotive electronics.

In the embodiment of the present invention, information stored in the storage unit includes "0" and "1".

Herein, the data "0" of the storage unit can correspond to the stored information "0" of the second gate structure 402 and the stored information "1" of the third gate structure 403. When "0" is written, a negative voltage is applied to the first polycrystalline silicon gate 4 of the first gate structure 401, a positive voltage is applied to the second polycrystalline silicon gates 8 of the second gate structure 402 and the third gate structure 403, a weak positive voltage is applied to the first source-drain region 9a, and a negative voltage is applied to the second source-drain region 9b, such that electrons can be injected into the second nitride layer of the ONO layer 7 of the third gate structure 403 under the effect of the difference between the positive voltage and the negative voltage of the second polycrystalline silicon gate 8 of the third gate structure 403 and the second source-drain region 9b, "1" is written into the third gate structure 403, and the threshold voltage of the second gate structure 402 is lower than the threshold voltage of the third gate structure 403, i.e., information written into the second gate structure 402 is "0". When data is read, a judgment is made by comparing the reading currents of the channels in the areas covered by the second gate structure 402 and the third gate structure 403.

Contrarily, the data "1" of the storage unit can correspond to the stored information "1" of the second gate structure 402 and the stored information "0" of the third gate structure 403. When "1" is written, a negative voltage is applied to the first polycrystalline silicon gate 4 of the first gate structure 401, a positive voltage is applied to the second polycrystalline silicon gates 8 of the second gate structure 402 and the third gate structure 403, a negative voltage is applied to the first source-drain region 9a, and a weak positive voltage is applied to the second source-drain region 9b, such that electrons can be injected into the second nitride layer of the ONO layer 7 of the second gate structure 402 under the effect of the difference between the positive voltage and the negative voltage of the second polycrystalline silicon gate 8 of the second gate structure 402 and the first source-drain region 9a, "1" is written into the second gate structure 402, and the threshold voltage of the third gate structure 403 is lower than the threshold voltage of the second gate structure 402, i.e., information written into the third gate structure 403 is "0". When data is read, a judgment is made by comparing the reading currents of the channels in the areas covered by the second gate structure 402 and the third gate structure 403.

The storage unit of the SONOS memory according to the embodiment of the present invention adopts 3 gate structures, the first gate structure 401 is formed by the gate dielectric layer 3 and the first polycrystalline silicon gate 4 through superposition and serves as a selection gate, the second gate structure 402 and the third gate structure 403 are respectively formed by the ONO layer 7 and the second polycrystalline silicon gate 8 through superposition, and the second polycrystalline silicon gate 8 is in a sidewall structure and is formed on two sides of the first gate structure 401 through self-alignment, such that the second gate structure 402 and the third gate structure 403 are formed on two sides of the first gate structure 401 through self-alignment. Since the self-aligned structure can minimize the size of the device, the area of the device can be greatly reduced in the embodiment of the present invention.

In addition, since the second gate structure 402 and the third gate structure 403 of the storage unit of the embodiment of the present invention are both used as storage gates, two bits of information can be stored in one storage unit. Since in the embodiment of the present invention the two storage states, i.e., the two opposite states of information stored in the second gate structure 402 and the third gate structure 403 of the same storage unit are used storage information of the entire storage unit, and the storage information of the storage unit is judged by comparing the magnitude of the reading currents corresponding to the second gate structure 402 and the third gate structure 403, i.e., a differential technology is adopted, the embodiment of the present invention can greatly improve the reliability of the product and can be applied to products requiring higher reliability, such as automotive electronics.

Moreover, the second gate structure 402 and the third gate structure 403 of the embodiment of the present invention are defined on the two sides of the first gate structure through self-alignment, no additional lithography process is required and thus the process cost of the embodiment of the present invention is low.

Figure 6A:
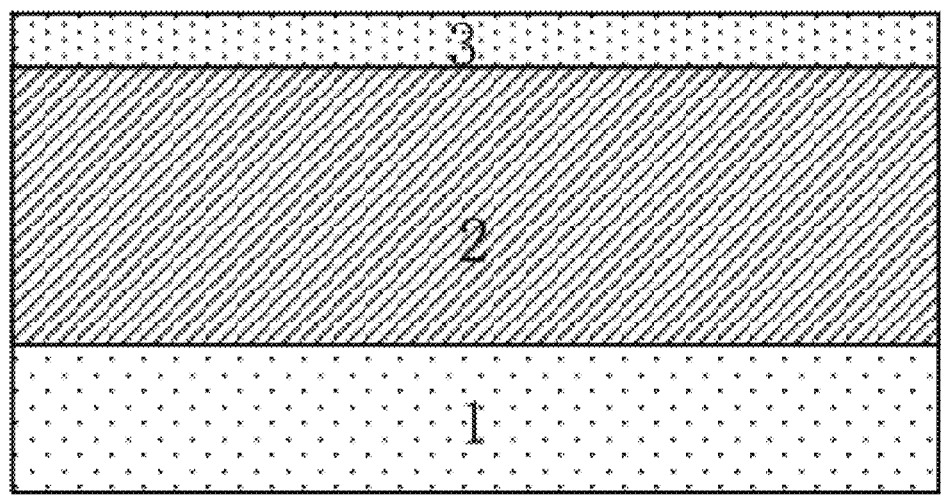
FIG. 6A to FIG. 6H illustrate structural views of a storage unit in each step of a method for manufacturing a SONOS memory according to one embodiment of the present invention.

As illustrated in FIG. 6A to FIG. 6H, which illustrate structural views of a storage unit in each step of a method for manufacturing a SONOS memory according to one embodiment of the present invention, steps of manufacturing a storage unit of the SONOS memory in the method for manufacturing the SONOS memory according to the embodiment of the present invention comprise the following steps:

In step 1, as illustrated in FIG. 6A, a gate dielectric layer 3 is grown on the surface of a semiconductor substrate.

The semiconductor substrate is a silicon substrate.

The gate dielectric layer 3 is a gate oxide layer.

A P-well 2 is formed in the semiconductor substrate in the formation area of the storage unit.

The P-well 2 is formed in a deep N-well 1 and the deep N-well 1 is formed in the semiconductor substrate.

Figure 6B:
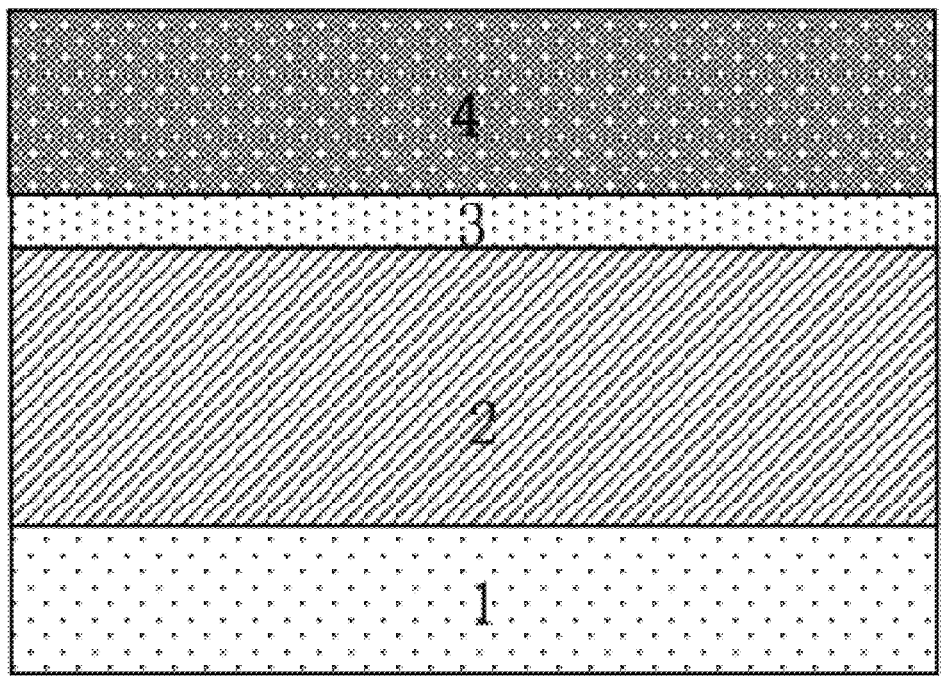

As illustrated in FIG. 6B, a first polycrystalline silicon gate 4 is deposited.

Figure 6C:
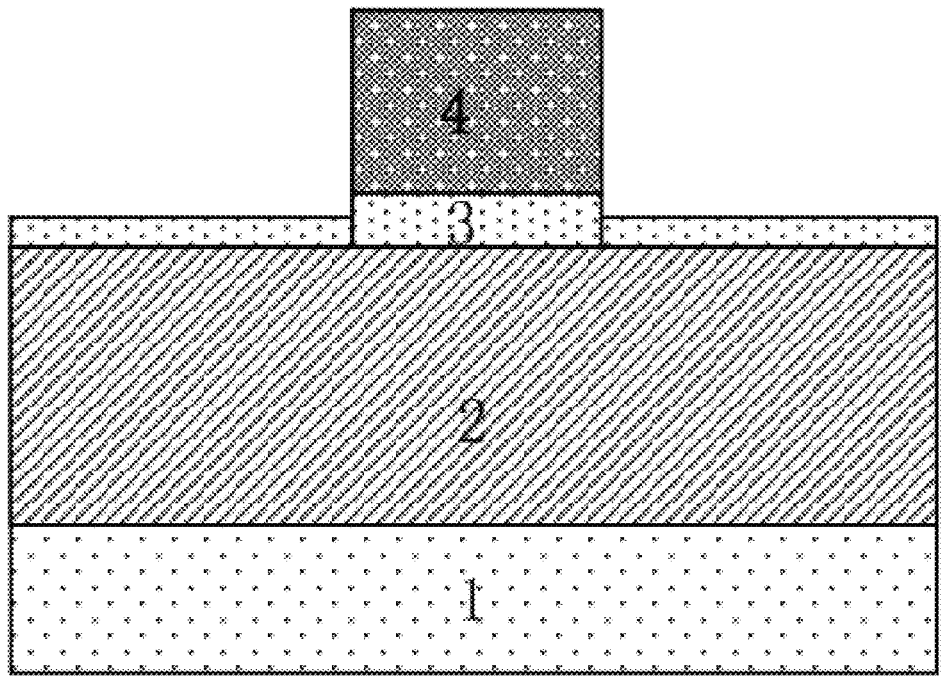

As illustrated in FIG. 6C, a first gate structure 401 formed by the gate dielectric layer 3 and the first polycrystalline silicon gate 4 through superposition is formed in a selected area by adopting a lithography definition and polycrystalline silicon etching process.

Figure 6D:
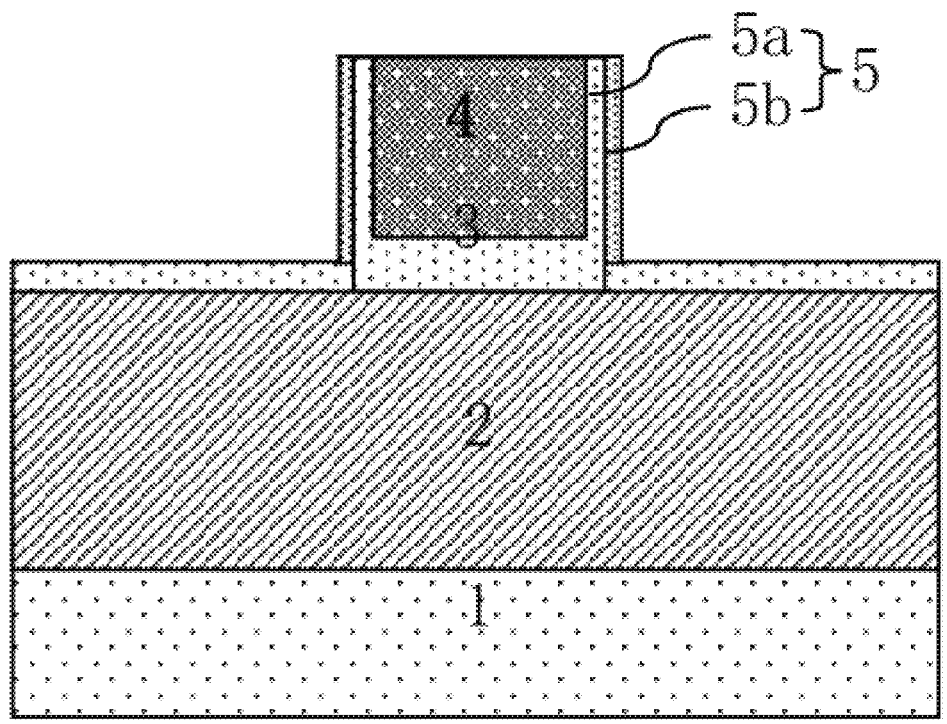

In step 2, as illustrated in FIG. 6D, first sidewalls 5 are formed on two side surfaces of the first gate structure 401 through self-alignment. The material of the first sidewalls 5 comprises an oxide layer or a nitride layer. In FIG. 6D, the first sidewalls 5 are formed by an oxide layer 105a and a nitride layer 105b through superposition.

Figure 6E:
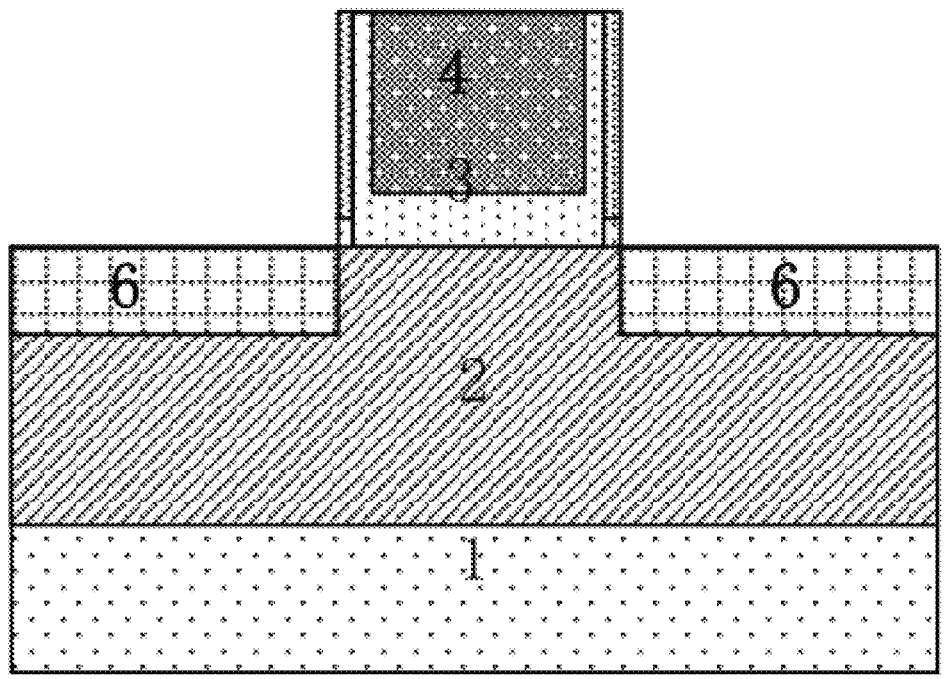

In step 3, as illustrated in FIG. 6E, a subsequently formed tunneling injection region 6 is opened by adopting a tunneling injection mask. In the embodiment of the present invention, the storage region of the entire SONOS memory is opened by adopting the tunneling injection mask, such that the tunneling injection region 6 can be opened. A logic device region is also formed outside the storage region.

Then, the gate dielectric layer 3 outside the first gate structure 401 in the opened area is removed. Ion injection is performed to form the tunneling injection region 6.

Figure 6F:
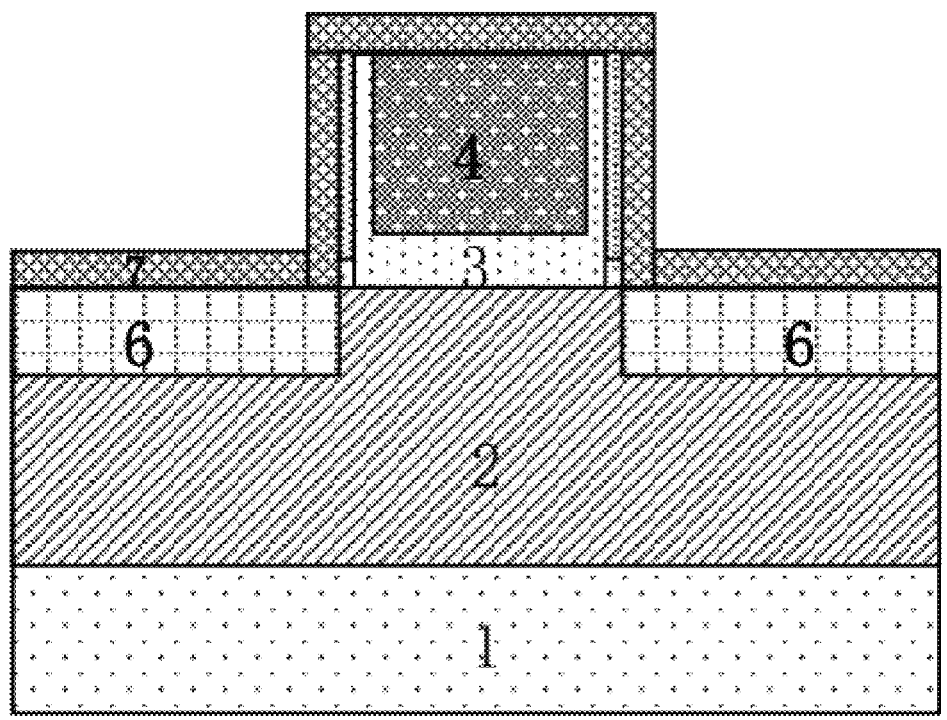

As illustrated in FIG. 6F, then an ONO layer 7 is deposited. The ONO layer 7 covers the side surfaces of the first sidewalls 5, the top surface of the first polycrystalline silicon gate 4 and the surface of the semiconductor substrate outside the first gate structure 401. The ONO layer 7 is formed by a first oxide layer, a second nitride layer and a third oxide layer through superposition, and the second nitride layer is used for storing information.

After depositing the ONO layer 7, the method further comprises a step of performing definition by using an ONO layer mask and etching the ONO layer 7 for removing the ONO layer 7 in the logic device region (not shown) outside the formation area, i.e., the storage region of each storage unit of the SONOS memory.

Figure 6G:
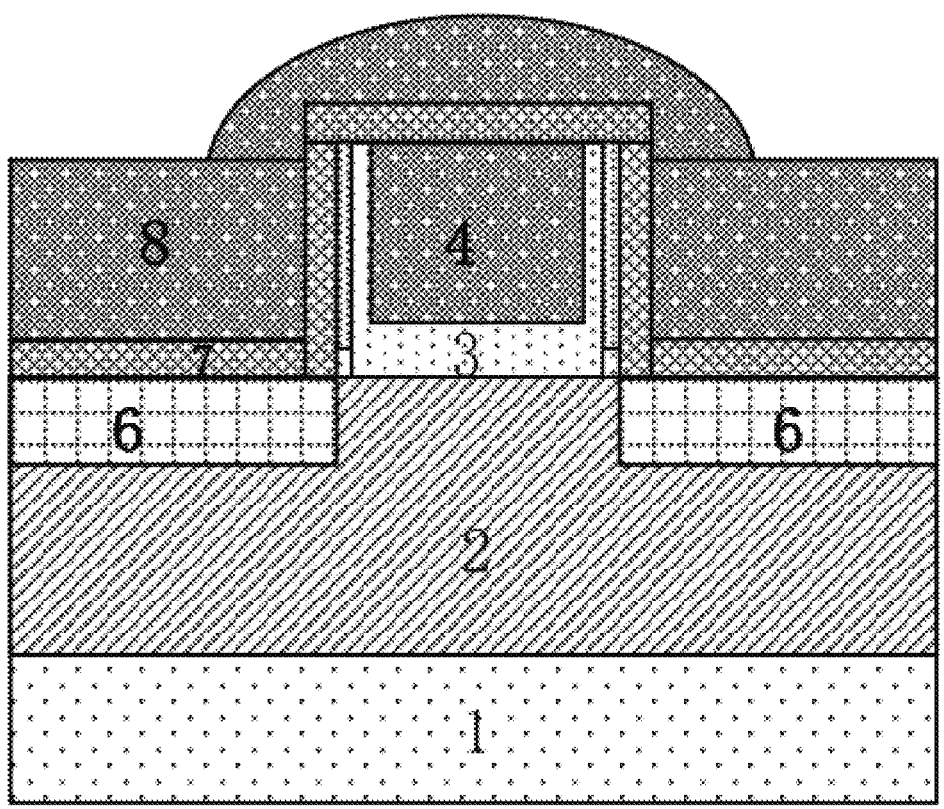

In step 4, as illustrated in FIG. 6G, a second polycrystalline silicon gate 8 is deposited. The second polycrystalline silicon gate 8 covers the surface of the ONO layer 7.

Figure 6H:
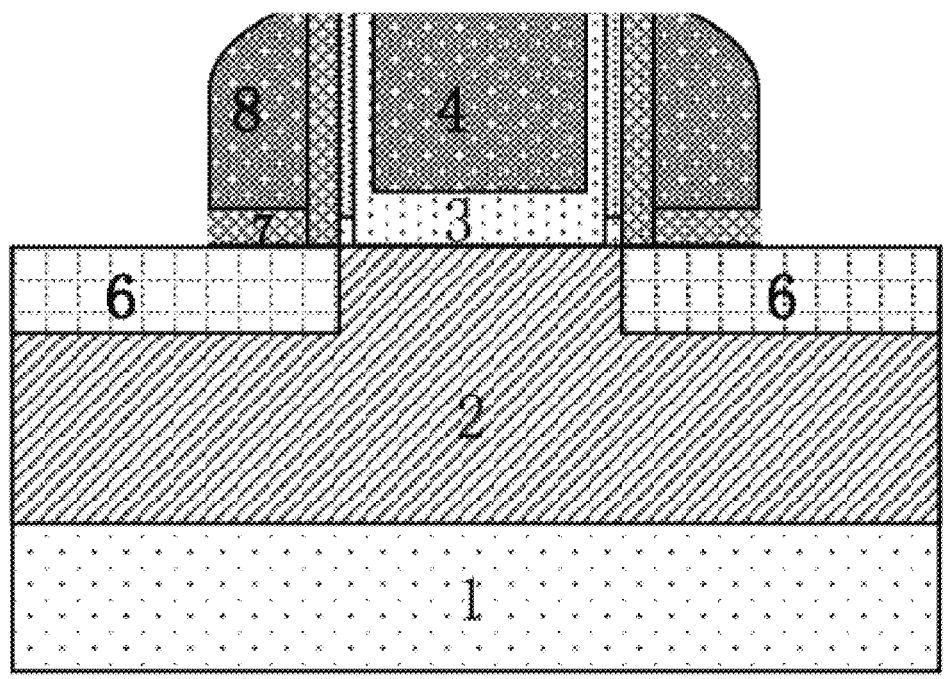

In step 5, as illustrated in FIG. 6H, comprehensive polycrystalline silicon etching is performed to form the second polycrystalline silicon gate 8 which is in a sidewall structure on the side surface of the corresponding first sidewall 5 through self-alignment.

The second gate structure 402 and the third gate structure 403 are respectively formed by the ONO layer 7 and the second polycrystalline silicon gate 8 through superposition, the second gate structure 402 is formed on the side surface of the first sidewall 5 on the first side surface of the first gate structure 401 through self-alignment, and the third gate structure 403 is formed on the side surface of the first sidewall 5 on the second side surface of the first gate structure 401 through self-alignment.

The first sidewall 5 realizes the isolation between the first polycrystalline silicon gate 4 and the corresponding second polycrystalline silicon gate 8. In the method of the invention embodiment, the first polycrystalline silicon gate 4 and the corresponding second polycrystalline silicon gate 8 are further isolated by the ONO layer 7.

As illustrated in FIG. 5, after forming the second polycrystalline silicon gate 8 in the sidewall structure in step 5, the method further comprises a step of performing self-aligned N+ injection to form a first source-drain region 9a and a second source-drain region 9b, the first source-drain region 9a is formed in the P-well 2 outside the side surface of the second gate structure 402 through self-alignment, and the second source-drain region 9b is formed in the P-well 2 outside the side surface of the third gate structure through self-alignment 403.

The first gate structure 401 forms a selection gate, and the second gate structure 402 and the third gate structure 403 form two storage gates; states of information stored in the second gate structure 402 and the third gate structure 403 in the same storage unit are opposite, and the storage information of the storage unit is judged by comparing the magnitude of the reading currents corresponding to the second gate structure 402 and the third gate structure 403.

The invention has been described in detail above through the specific embodiments, but these embodiments do not form limitations to the present invention. Without departing from the principle of the present invention, one skilled in the art may make many modifications and improvements, which shall also be regarded as the protection scope of the present invention.

What is claimed is:

1. A SONOS memory, wherein a storage unit of the SONOS memory comprises:
   a first gate structure formed by a gate dielectric layer formed on a surface of a semiconductor substrate and a first polycrystalline silicon gate through superposition;
   first sidewalls formed on two side surfaces of the first gate structure through self-alignment; and
   a second gate structure formed on a side surface of the first sidewall on a first side surface of the first gate structure through self-alignment, and a third gate structure formed on a side surface of a first sidewall on a second side surface of the first gate structure through self-alignment, the second gate structure and the third gate structure being each formed by an ONO layer and a second polycrystalline silicon gate through superposition, the second polycrystalline silicon gate being in a sidewall structure, the ONO layer is also formed on the side surface of the first sidewall, and the first sidewall and the ONO layer realizing an isolation between the first polycrystalline silicon gate and the corresponding second polycrystalline silicon gate;

the ONO layer being formed by a first oxide layer, a second nitride layer, and a third oxide layer through superposition, and the second nitride layer being used for storing information; and the first gate structure forming a selection gate, and the second gate structure and the third gate structure forming two storage gates, states of information stored in the second gate structure and the third gate structure in a same storage unit being opposite, the two opposite states of information stored in the second gate structure and the third gate structure of the same storage unit are used as storage information of an entirety of the storage unit and the storage information of the storage unit is read in a differential way, and the storage information of the storage unit being judged by comparing a magnitude of reading currents corresponding to the second gate structure and the third gate structure, wherein a P-well is formed in the semiconductor substrate in a formation area of the storage unit, and wherein a tunneling injection region is formed in a surface area of the P-well covered by the second gate structure and the third gate structure.

2. The SONOS memory according to claim 1, wherein the semiconductor substrate is a silicon substrate.

3. The SONOS memory according to claim 2, wherein the gate dielectric layer is a gate oxide layer.

4. The SONOS memory according to claim 1, wherein the P-well is formed in a deep N-well and the deep N-well is formed in the semiconductor substrate.

5. The SONOS memory according to claim 1, wherein a first source-drain region consisting of $N_+$ regions is formed in the P-well outside the side surface of the second gate structure through self-alignment; and a second source-drain region consisting of $N_+$ regions is formed in the P-well outside the side surface of the third gate structure through self-alignment.

6. The SONOS memory according to claim 1, wherein the SONOS memory is a device applied to automotive electronic products.

7. A method for manufacturing a SONOS memory, wherein steps of manufacturing a storage unit of the SONOS memory comprise:

step 1: sequentially growing a gate dielectric layer and depositing a first polycrystalline silicon gate on a surface of a semiconductor substrate, and forming a first gate structure formed by the gate dielectric layer and the first polycrystalline silicon gate through superposition in a selected area by adopting a lithography definition and polycrystalline silicon etching process;

step 2: forming first sidewalls on two side surfaces of the first gate structure through self-alignment;

step 3: removing the gate dielectric layer outside the first gate structure, and then depositing an ONO layer, the ONO layer covering side surfaces of the first sidewalls, the top surface of the first polycrystalline silicon gate, and the surface of the semiconductor substrate outside the first gate structure;

the ONO layer being formed by a first oxide layer, a second nitride layer, and a third oxide layer through superposition, and the second nitride layer being used for storing information;

step 4: depositing a second polycrystalline silicon gate, the second polycrystalline silicon gate covering the surface of the ONO layer; and step 5: performing comprehensive polycrystalline silicon etching to form the second polycrystalline silicon gate which is in a sidewall structure on a side surface of the corresponding first sidewall through self-alignment;

a second gate structure and a third gate structure being each formed by the ONO layer and the second polycrystalline silicon gate through superposition, the second gate structure being formed on a side surface of the first sidewall on a first side surface of the first gate structure through self-alignment, and the third gate structure being formed on a side surface of the first sidewall on a second side surface of the first gate structure through self-alignment;

the first sidewall and the ONO layer realizing an isolation between the first polycrystalline silicon gate and the corresponding second polycrystalline silicon gate; and the first gate structure forming a selection gate, and the second gate structure and the third gate structure forming two storage gates, states of information stored in the second gate structure and the third gate structure in a same storage unit being opposite, the two opposite states of information stored in the second gate structure and the third gate structure of the same storage unit are used as storage information of an entirety of the storage unit and the storage information of the storage unit is read in a differential way, and the storage information of the storage unit being judged by comparing a magnitude of reading currents corresponding to the second gate structure and the third gate structure, wherein a P-well is formed in the semiconductor substrate in a formation area of the storage unit, wherein, before forming the ONO layer in step 3, the method further comprises a step of forming a tunneling injection region in a surface area of the P-well covered by the second gate structure and the third gate structure.

8. The method for manufacturing the SONOS memory according to claim 7, wherein the semiconductor substrate is a silicon substrate.

9. The method for manufacturing the SONOS memory according to claim 8, wherein the gate dielectric layer is a gate oxide layer.

10. The method for manufacturing the SONOS memory according to claim 7, wherein the tunneling injection region is defined by a tunneling injection mask, and after opening the tunneling injection region by using the tunneling injection mask, the method comprises a step of removing the gate dielectric layer in the opened area and a step of performing ion injection to form the tunneling injection region; and after depositing the ONO layer in step 3, the method further comprises a step of performing definition by using an ONO layer mask and etching the ONO layer for removing the ONO layer outside a formation area of each storage unit of the SONOS memory.

11. The method for manufacturing the SONOS memory according to claim 7, wherein the P-well is formed in a deep N-well and the deep N-well is formed in the semiconductor substrate.

12. The method for manufacturing the SONOS memory according to claim 7, wherein, after forming the second polycrystalline silicon gate in the sidewall structure in step 5, the method further comprises a step of performing self-aligned N+ injection to form a first source-drain region and a second source-drain region, the first source-drain region is formed in the P-well outside the side surface of the second gate structure through self-alignment, and the second source-drain region is formed in the P-well outside the side surface of the third gate structure through self-alignment.

* * * * *